(12) United States Patent
Bui et al.

(10) Patent No.: US 7,057,254 B2
(45) Date of Patent: Jun. 6, 2006

(54) FRONT ILLUMINATED BACK SIDE CONTACT THIN WAFER DETECTORS

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 0 days.

(21) Appl. No.: 10/797,324

(22) Filed: Mar. 10, 2004

(65) Prior Publication Data

US 2004/0222482 A1   Nov. 11, 2004

Related U.S. Application Data

(60) Provisional application No. 60/468,181, filed on May 5, 2003.

(51) Int. Cl.
*H01L 27/14* (2006.01)
(52) U.S. Cl. .................. 257/443; 257/414; 257/431
(58) Field of Classification Search ............... 257/443, 257/444, 445, 446, 447, 448, 449, 450, 451, 257/452, 453, 454, 455, 456, 457, 458, 459, 257/460, 461; 250/214.1, 214 A, 370.11, 250/370.14
See application file for complete search history.

(56) References Cited

U.S. PATENT DOCUMENTS 5,237,197 A * 8/1993 Snoeys et al.

* cited by examiner

*Primary Examiner*—Nathan J. Flynn
*Assistant Examiner*—Kevin Quinto
(74) *Attorney, Agent, or Firm*—Patent Metrix

(57) ABSTRACT

The present invention is directed toward a detector structure, detector arrays, a method of detecting incident radiation, and a method of manufacturing the detectors. The present invention comprises several embodiments that provide for reduced radiation damage susceptibility, decreased affects of cross-talk, and increased flexibility in application. In one embodiment, the present invention comprises a plurality of front side illuminated photodiodes, optionally organized in the form of an array, with both the anode and cathode contact pads on the back side. The front side illuminated, back side contact photodiodes have superior performance characteristics, including less radiation damage, less crosstalk using a suction diode, and reliance on reasonably thin wafers. Another advantage of the photodiodes of the present invention is that high density with high bandwidth applications can be effectuated.

32 Claims, 7 Drawing Sheets

| P+ S.D., 602b |
| P+ B.S., 603b |
| P+ A.P. 604b |

FRONT ILLUMINATED BACK SIDE CONTACT THIN WAFER DETECTORS

CROSS REFERENCE TO RELATED APPLICATIONS

This invention relies on, for priority, U.S. Provisional Application 60/468,181, having a priority date of May 5, 2003, entitled "DETECTORS WITH IMPROVED RADIATION DAMAGE AND CROSSTALK CHARACTERISTICS".

FIELD OF THE INVENTION

The present invention pertains generally to the field of radiation detectors, and in particular, relates to radiation detectors manufactured with thinner wafers, thereby yielding reduced crosstalk between detecting regions and decreased susceptibility to radiation damage, and with contacts extending from a front surface to a back surface, thereby permitting higher photodiode density applications.

BACKGROUND OF THE INVENTION

Arrays of photosensitive diodes are used in an assortment of applications including, but not limited to, radiation detection, optical position encoding, and low light-level imaging, such as night photography, nuclear medical imaging, photon medical imaging, multi-slice computer tomography (CT) imaging, and ballistic photon detection etc. Typically, photodiode arrays may be formed as one- or two-dimensional arrays of aligned photodiodes, or, for optical shaft encoders, a circular or semicircular arrangement of diodes.

One problem with detection devices is that they are susceptible to various radiation damage mechanisms, such as displacement damage resulting in total dose effects and ionization damage resulting in bulk effects. Both mechanisms adversely affect the performance of detectors, transistors and integrated circuits.

Certain detector characteristics that are most affected include detector leakage current, doping characteristics, charge collection, and carrier lifetime. Over time, detectors show an increased reverse-bias current and increased forward voltage drop due to radiation damage. Further, a change in doping level, due to radiation damage, adversely affects the width of the depletion region, i.e. the voltage required for full depletion and a decrease in carrier lifetime results in signal loss as carriers recombine while traversing the depletion region.

Another disadvantage with conventional detection devices is the amount and extent of crosstalk that occurs between adjacent detector structures, primarily as a result of minority carrier leakage current between diodes. The problem of crosstalk between diodes becomes even more acute as the size of detector arrays, the size of individual detectors, the spatial resolution, and the spacing of diodes are reduced.

In certain applications, it is desirable to produce optical detectors having small lateral dimensions and spaced closely together. For example in certain medical applications, it would beneficial to increase the optical resolution of a detector array in order to permit for improved image scans, such as computer tomography scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated. Therefore, the spatial resolution obtainable may be limited by diffusion of the carriers within the semiconductor itself, even if other components of the optical system are optimized and scattered light is reduced. Additionally, conventional front surface contact photodiodes require greater space devoted to electrical contacts and, therefore, limit the density of photodiodes in a given application.

Various approaches have been used to minimize such crosstalk including, but not limited to, providing inactive photodiodes to balance the leakage current, as described in U.S. Pat. Nos. 4,904,861 and 4,998,013 to Epstein et al., the utilization of suction diodes for the removal of the slow diffusion currents to reduce the settling time of detectors to acceptable levels, as described in U.S. Pat. No. 5,408,122, and providing a gradient in doping density in the epitaxial layer, as described in U.S. Pat. No. 5,430,321 to Effelsberg.

Additionally, certain applications require the placement of electrical contacts in a manner that does not obstruct an illuminating surface, such as with front illuminated photodiode arrays. U.S. Pat. Nos. 6,510,195 and 6,426,991 attempt to disclose a top-surface photodiode array. However, these disclosures fail to provide sufficient teachings to inform one of ordinary skill in the art how to manufacture such modified top-surface photodiode arrays.

Despite attempts to improve the overall performance characteristics of photodiode arrays and their individual diode units, within detection systems, photodiode arrays capable of reducing crosstalk while being less susceptible to radiation damage are still needed. Additionally, there is need for a semiconductor circuit and an economically feasible design and fabrication method so that it is capable of improving the spatial resolution of detectors integrated therein.

SUMMARY OF THE INVENTION

The present invention is directed toward a detector structure, detector arrays, a method of detecting incident radiation, and a method of manufacturing the detectors. The present invention comprises several embodiments that provide for reduced radiation damage susceptibility, decreased affects of cross-talk, and increased flexibility in application. The present invention comprises a plurality of front side illuminated photodiodes, optionally organized in the form of an array, with both the anode and cathode contact pads on the back side. The front side illuminated, back side contact (FSL-BSC) photodiodes have superior performance characteristics, including less radiation damage, less crosstalk using a suction diode, and reliance on reasonably thin wafers. Another advantage of FSL-BSC photodiodes of the present invention is that high density with high bandwidth applications can be effectuated.

In one embodiment, the photodiode array comprises a substrate having at least a front side and a back side, photodiodes integrally formed in the substrate forming the array, a plurality of electrical contacts in electrical communication with the back side, and a plurality of suction diodes positioned at selected locations within the array. The fabrication of the array involves a masking process comprising the steps of applying a first p+ mask on the front side and applying a second p+ mask on the back side.

Preferably, the array substrate is made of n doped silicon. Also preferably, the substrate is encircled by a metallic ring.

In one embodiment, the photodiodes and suction diodes in the array have a front surface, back surface, and side walls where the side walls are covered by a first insulating layer, a first conducting layer, and a second insulating layer. The first insulating layer and/or second insulating layer are an oxide. The conductive layer is doped poly-silicon. The second insulating layer is in physical communication with a filler, such as undoped poly-silicon.

In one embodiment, each photodiodes has a middle layer juxtaposed between a front layer and a back layer. The middle layer comprises a doped material of n conductivity type. The back layer comprises a n+ layer in electrical communication with a metal to form a cathode. The front layer comprises a doped material of p+ conductivity type. The front p+ layer is in electrical communication with a metal to form an anode.

In another embodiment, the present invention covers a photodiode array having a substrate with at least a front side and a back side; a plurality of photodiodes integrally formed in the substrate forming the array wherein each photodiode has a middle layer juxtaposed between a front layer and a back layer; a plurality of electrical contacts in electrical communication with the back side; and suction diodes positioned at selected locations within the array, wherein the fabrication of said array involves a masking process comprising the steps of applying a first p+ mask on said front side and applying a second p+ mask on said back side. In this embodiment, the middle layer comprises a doped material of p conductivity type, the back layer comprises a p+ layer in electrical communication with a metal to form a anode, and the front layer comprises a doped material of n+ conductivity type.

The array is preferably manufactured by using a start material, such as a round sliced wafer, subjected to a standard mask oxidation process that results in layers of $SiO_2$ on both front and back surfaces of the wafer. A n+ layer is formed through selective diffusion of n+ dopants. Prior to n+ diffusion on the back side of the wafer, the $SiO_2$ sublayer is selectively etched on the back side to ensure certain regions retain the $SiO_2$ sublayer.

After the etching has been selectively performed, the regions, which are devoid of the protective the $SiO_2$ layer, are subjected to a controlled n+ diffusion resulting in the formation of shallow n+ regions on the back side of the wafer. Once the n+ diffusion on the back side of the wafer is complete, a p+ fishbone mask is applied on the front side of the wafer and a p+ mask is applied on the back side. Alternatively, a fishbone mask need not be used and, instead, a full diffusion approach may be applied. The front side of the wafer, coated with the $SiO_2$ layer is preferably subjected to selective etching, utilizing the p+ fishbone mask to ensure certain regions retain the $SiO_2$ layer while others remain devoid of it.

Holes are laser cut within the wafer using a hole cutting technique, such as laser cutting. The formation of holes within the wafer substrate is followed by boron diffusion and the concurrent p+ doping of the opening areas and diffusion of boron onto the walls of the holes. Holes are formed by the laser beam emitted from the laser scribing device such that they extend through the wafer, across its thickness in entirety, and to the back side of the wafer. The holes serve as contact holes used for making an electrical connection between a front surface p+ layer and a back surface electrical contact.

Once contact holes have been cut, open areas and sidewalls of the holes are doped with a material of selected conductivity type, such as n-type or p-type. At least a portion of the $SiO_2$ layer is stripped off and an anti-reflective (AR) coating layer is deposited on the wafer. This is followed by the growth of a layer of $SiO_2$ via a standard oxidation process.

The front side of the wafer comprises AR coating and the back side comprises a grown oxide $SiO_2$ layer. A contact window masking, followed by etching of the contact window oxide on the back side of the wafer, is performed. An n+ ring is etched at the periphery of the wafer. The back side of the wafer is metallized using an alloy of aluminum-nickel-gold (Al—Ni—Au), after which metal masking and etching is performed on the back side of the wafer.

BRIEF DESCRIPTION OF THE DRAWINGS

These and other features and advantages of the present invention will be appreciated, as they become better understood by reference to the following detailed description when considered in connection with the accompanying drawings:

FIG. 1b is a side perspective view of cross-sectional detail 'A' from FIG. 1a;

FIG. 2b is a side perspective view of cross-sectional detail 'B' from FIG. 2a;

FIG. 3b is a top perspective view of area detail 'B' from FIG. 3a;

FIG. 4b is a perspective view of area detail 'B' from FIG. 4a;

FIG. 5b is a side perspective view of area detail 'C' from FIG. 5a;

DESCRIPTION OF THE INVENTION

The present invention is directed toward a detector structure, detector arrays, a method of detecting incident-radiation, and a method of manufacturing the detectors. The present invention comprises several embodiments that provide for reduced radiation damage susceptibility, decreased affects of cross-talk, and increased flexibility in application. Various modifications to the disclosed embodiments will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

In one embodiment, the present invention comprises a plurality of front side illuminated photodiodes, optionally organized in the form of an array, with both the anode and cathode contact pads on the back side. The front side illuminated, back side contact (FSL-BSC) photodiodes have superior performance characteristics, including less radiation damage, less crosstalk using a suction diode, and reliance on reasonably thin wafers.

Figure 1A:
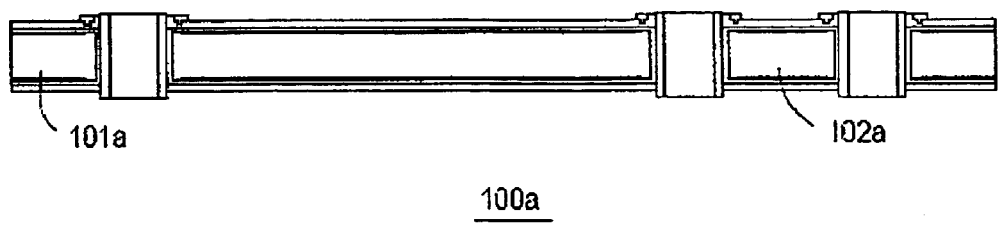
FIG. 1a is a cross sectional view of one embodiment of a silicon wafer formed in accordance with the present invention.

Referring now to FIG. 1a, a cross sectional view of a silicon wafer 100a formed in accordance with the present invention is shown. A plurality of photodiode sections 102a, 101a are formed within the silicon wafer 100a. While it is preferred that the wafer substrate be comprised of silicon, one of ordinary skill in the art would appreciate that any suitable semiconductor material, which can be processed in accordance with the processing steps of the present invention, may be used. Although only one complete diode element 102a is illustrated in FIG. 1a, it is understood that a typical array or matrix of such diode elements would comprise a plurality of such diode elements. A person of ordinary skill would appreciate that the number of photodiodes incorporated in the semiconductor device is not limited to a specific number and can be adjusted to suit varied operational specifications. The encircled area "A" demarcates a portion of the photodiode array 100a and, more specifically, photodiode 102a.

Figure 1B:
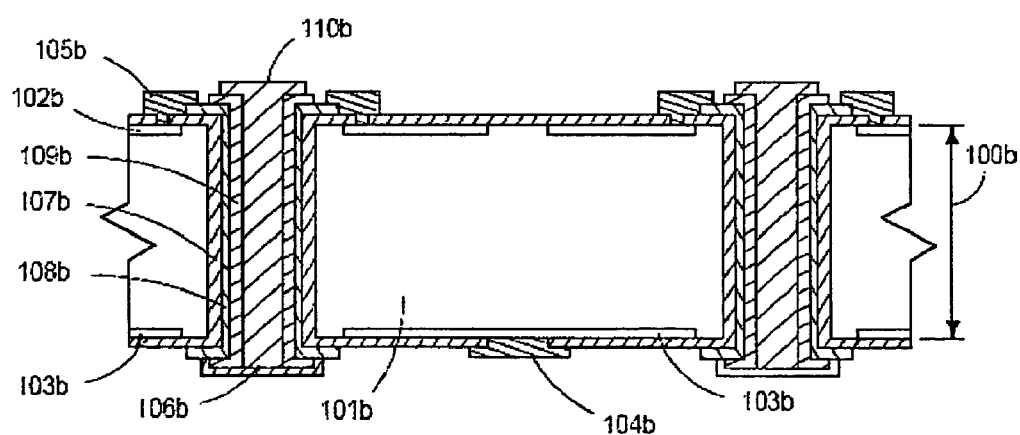

Shown in FIG. 1b is a detailed side perspective of the cross sectional area circled in FIG. 1a and labeled as "A". Within wafer 100b is a diode 101b having an active region juxtaposed between a p+ layer 102b and a n+ layer 103b. The p+ layer 102b is positioned proximate to the front facing surface of the diode element whereas the n+ layer 103b is positioned proximate to the back facing surface. The two layers 102b, 103b are spaced apart by a distance almost equal to, and slightly less than, the thickness of the wafer 100b. Preferably, the silicon wafer 100b is of a thickness at or about 175 micron. The present invention preferably uses a wafer having thickness in the range of 125 micron to 300 micron where the conventional wafer thickness is generally 400 micron. The n+ layer 103b is in electrical communication with metallic area, region, or pad to form a back side cathode 104b. The p+ layer 102b is in electrical communication, preferably at a plurality of points, with a metallic area, region, or pad to form a front surface anode 105b. The front surface anode 105b is in electrical communication with a conductive conduit that leads from the front surface anode 105b to a back side anode 106b.

To bring the contacts from the front side to the back side holes are made through the wafer by means of laser cutting technique or silicon dry etching technique. Therefore, the front side and back side of each photodiode 101b are in electrical communication via a connection region. The connection region is generated by the insertion of holes, voids, or vias between photodiode regions and the use of conductive and insulating material to fill those vias, thereby enabling electrical communication between a front side p+ layer and a backside p+anode while still maintaining electrical isolation between the photodiode active regions.

A connection region is formed by forming holes between active regions of each photodiode 101b and within the wafer 100b. A first oxide insulation layer 107b is formed on the surface of the sidewalls of the holes, thereby forming a first and innermost insulation layer, relative to the photodiode active regions. A conductive layer 108b is deposited over the first oxide insulation layer 107b and serves as the electrical conduit to enable electrical communication between the p+ layer 102b and back side anode 106b. For example, and by no way of limitation, it is preferred that the conductive layer 108b be comprised of doped poly-silicon. Doped poly-silicon can withstand high temperature processing, can be deposited conformally using chemical vapor deposition methods, forms an effective ohmic contact, and resists corrosion.

A second oxide insulation layer 109b is deposited atop the conductive layer 108b thereby forming an outermost insulating layer separating the active regions of the adjacent diode elements 101b. The innermost insulating layer 107b, conductive layer 108b, and outermost insulating layer 109b (collectively referred to herein as a tri-layer) are formed on each side of the sidewalls of the holes separating the photodiode active regions. A void area or region exists between a first tri-layer, formed on the sidewall of a first photodiode region and a second tri-layer, formed on the sidewall of a second photodiode region. The void region is preferably filled with undoped poly-silicon 110b.

Figure 2A:
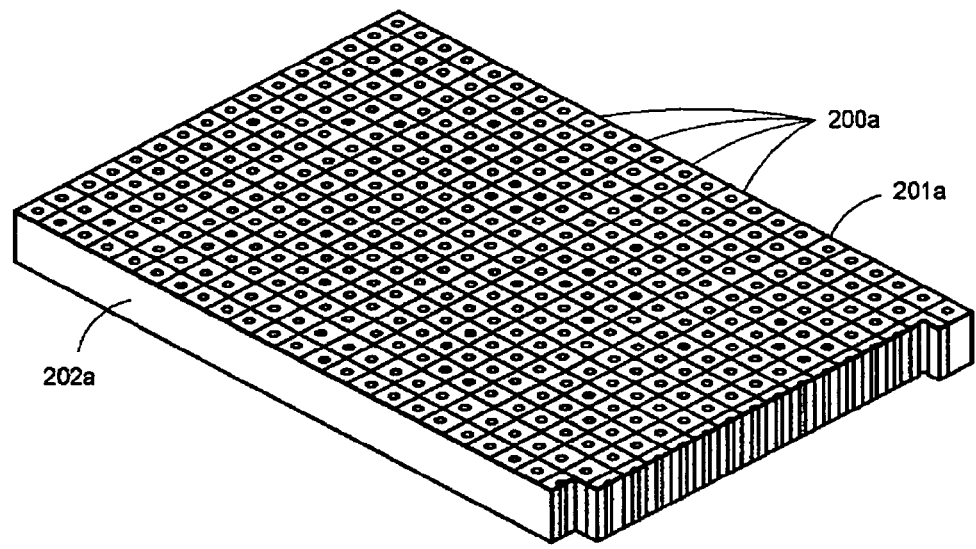
FIG. 2a is a top perspective view of one embodiment of a photodiode array formed in accordance with the present invention.
Figure 2B:
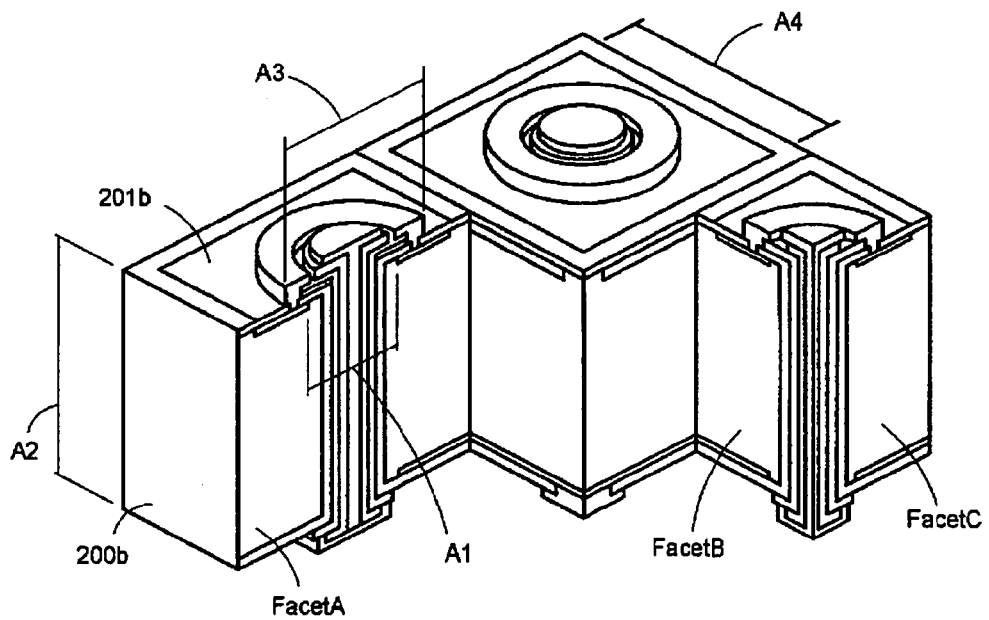

A different schematic view of the FSL-BSC photodiode is shown in FIGS. 2a and 2b. Square boxes represent diode elements 201a within the photodiode array 200a. The photodiode array 200a is arranged in the form of a matrix with over 320 diode elements 201a on the silicon wafer 202a. Although an array of a limited number of diode elements 201a is illustrated in FIG. 2a, it is understood that an array or matrix of diode elements falling within the scope of the present invention may have any number of diode elements. A person of ordinary skill would appreciate that the number of photodiodes incorporated in the silicon wafer is not limited to the aforesaid number and can be adjusted to suit varied operational specifications.

In one embodiment, an exemplary photodiode array 200a possesses the following characteristics: pitch length between two adjacent diode elements 201a of 1.4083 mm, a length of the silicon wafer 202a at approximately 21.8520 mm, and a breadth of the silicon wafer 202a at approximately 22.4028 mm. The area labeled as "B" demarcates a portion of the silicon wafer 202a, which is presented in further detail in FIG. 2b.

The facets marked "A", "B", and "C" depict a plurality of cross-sectional views of the diode elements 201b, when sliced via planes that are normal (i.e. perpendicular) to their top surface. For purposes of describing an exemplary embodiment and not by way of limitation, A1 represents the internal diameter of the void region between the two tri-layers, A2 represents the thickness of the wafer 200b, A3 represents external diameter of the cap which covers the two front side anode contacts, two tri-layers, and void region between two adjacent diodes, and A4 represents an exposed front surface area of diode element 201b. In one embodiment, the diode array possesses the following characteristics: A1 is at or about 0.175 mm; A2 is at or about 0.050 mm; A3 is at or about 0.150 mm; and A4 is at or about 1.000 mm. It must be noted here that the above dimensional characteristics can be modified to suit changing requirements.

Figure 3A:
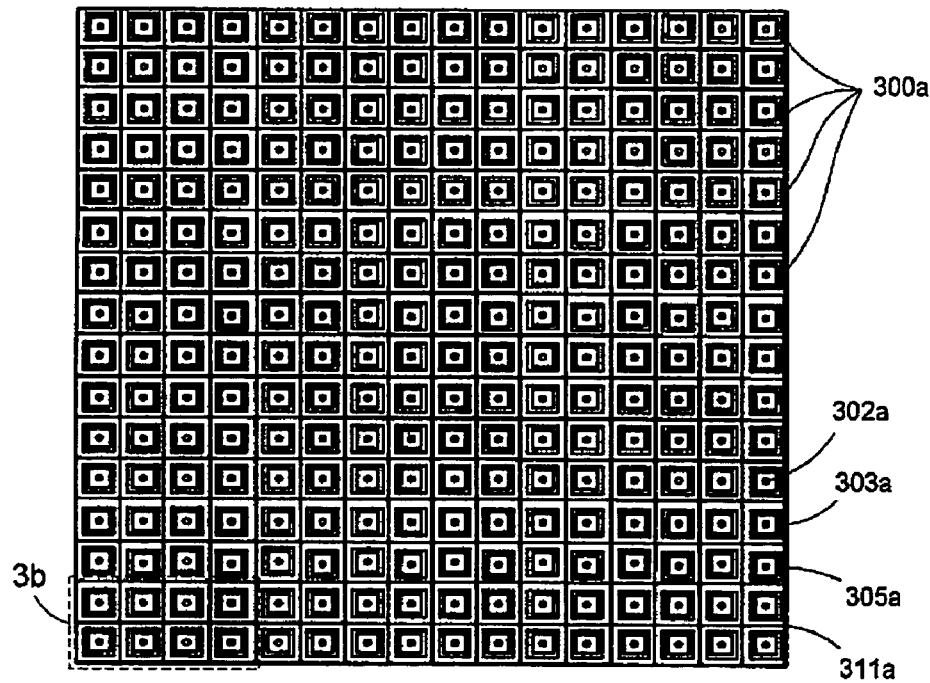
FIG. 3a is a top view of one embodiment of the photodiodes of the present invention.
Figure 3B:
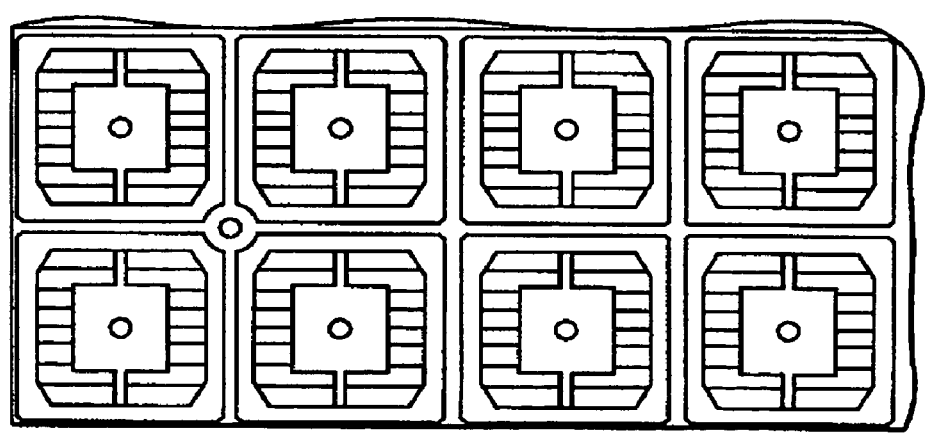

FIGS. 3a and 3b show top views of photodiodes of the present invention. Within the diode array 300a, active regions 305a of the diode elements 303a serve to provide surfaces onto which light impinges. Interconnections between diode elements 303a are made through back surface contacts (not shown) located in approximate vertical alignment with central areas 302a. Wire interconnections 311a are preferably minimized. Preferably, wire interconnections are made at the back of the diode array 300a and are made available for creating electrical connections with external circuits, such as printed circuit boards (PCBs) and other devices. The dotted circle, labeled as "A", demarcates a portion of the photodiode array 300a, whose magnified view is given in FIG. 3b. The section view "A—A" is shown in FIG. 3b.

Figure 4A:
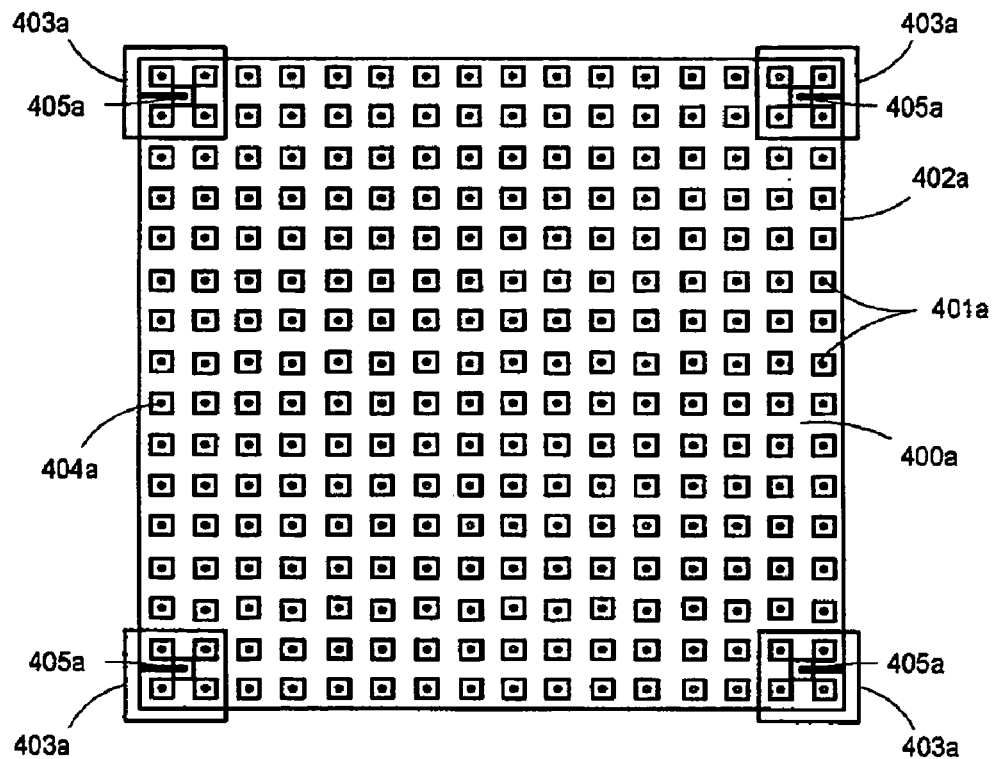
FIG. 4a is a bottom view of one embodiment of the photodiodes of the present invention.
Figure 4B:
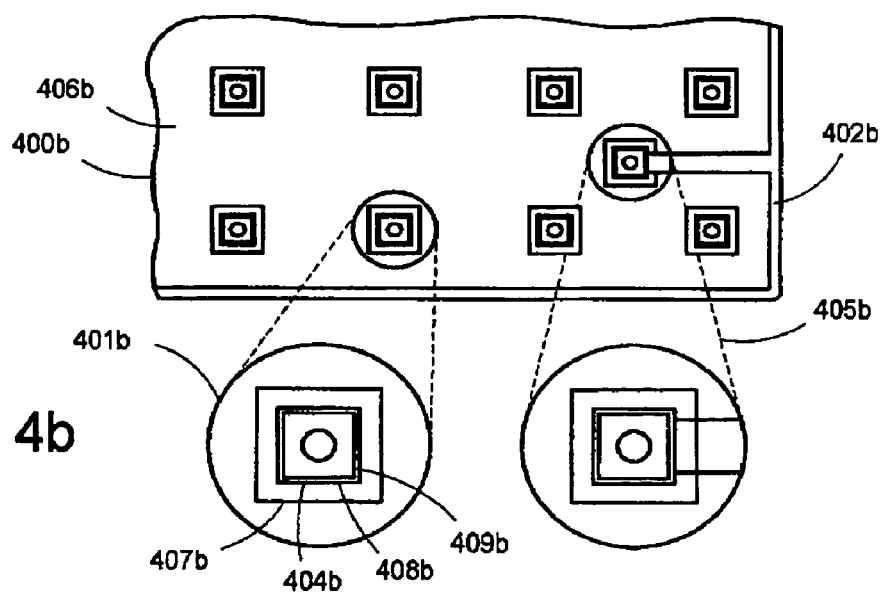

Referring to FIGS. 4a and 4b, a bottom view of one embodiment of a photodiode of the present invention is shown. A silicon wafer 400a is enclosed by a ring 402a made of suitable metal. The silicon underneath metal ring 402a is heavily doped with an impurity of selected conductivity type, either n-type or p-type. For example, and by no way of limitation, a n+ metal ring is utilized to surround the silicon wafer 400a in accordance with the principles of the present invention.

At each of four corners of the silicon wafer 400a is a set of diode elements 403a comprised of four diode elements 404a and a central suction diode 405a. Although only four suction diodes 405a and a 16×16 array of diodes 404a are shown, it is understood that a typical array may have additional diode elements at a plurality of positions in various other arrangements, other than those detailed herein.

Suction diodes 405a absorb tailing current and thereby assist in reducing cross-talk between individual diodes 404a. Typically, photodiode arrays may be formed as one- or two-dimensional arrays of aligned photodiodes, or, for optical shaft encoders, a circular or semicircular arrangement of diodes. In similar situations, where possible arrangements of photodiodes include, but are not limited to, one-dimensional, circular, and semicircular types, the total number of suction diodes may vary according to the need. The dotted circle labeled as "B" is further detailed in FIG. 4b.

Referring to FIG. 4b, an insulating layer 406b, such as silicon dioxide, covers the back surface of the silicon wafer 400b. The metal ring 402b, entirely surrounding the edge of the silicon wafer 400a, comprises a lateral extension which is in physical communication with the suction diode 405b.

Areas C and D, provided in an exploded view form within Figure B, depict detailed views of individual diode element 401b and suction diode 405b. Area "C" shows an active photodiode region comprising a metal layer 404b layered atop a n+ layer 407b. A p+ layer 408b is layered atop the metal layer 404b and forms a p+ pad as an individual pixel electronic contact for diode element 401b. A contact layer 409b is formed on the p+ layer 408b. In one embodiment, the individual diode element 401b has the following specifications: diameter of the contact hole 0.125 mm, area of the n+ layer 407b 0.2025 mm$^2$, area of the metal layer 404b 0.09 mm$^2$, and area of the contact layer 409b 0.0625 mm$^2$. The construction of the suction diode, shown in Area "D", is substantially the same as active photodiode region of Area "C".

Figure 5A:
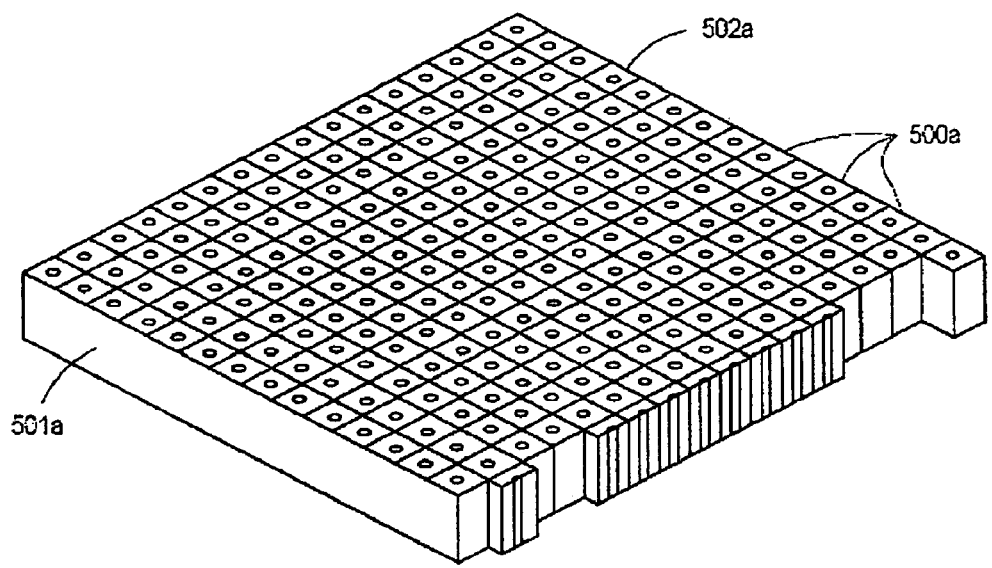
FIG. 5a is a side perspective view of one embodiment of the present invention.
Figure 5B:
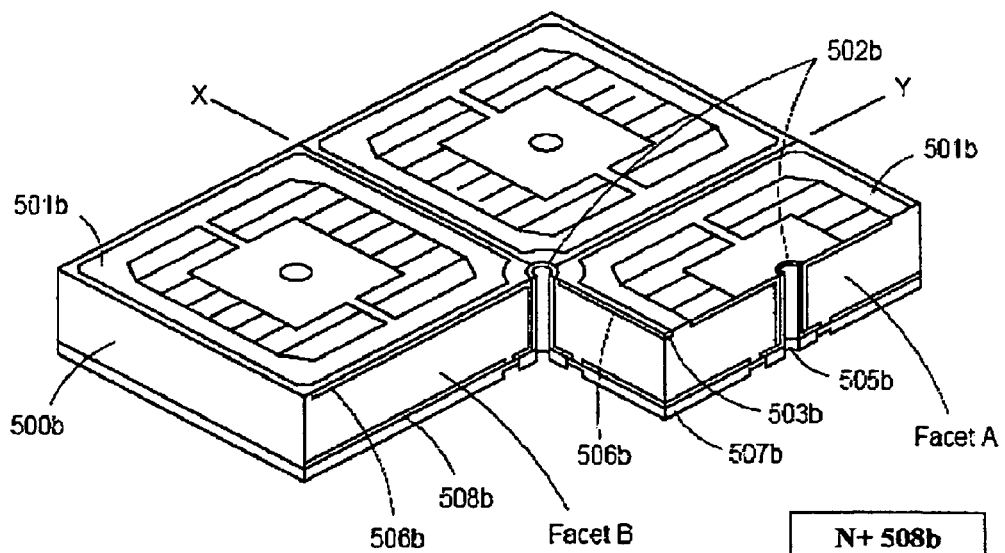

Referring to FIGS. 5a and 5b, side perspective views of one embodiment of the present invention are illustrated. In one embodiment, the photodiode array 500a comprises a wafer 501a having a length at or about 22.4028 mm and a breadth at or about 21.8520 mm. The substantially square elements represent individual diode elements 502a, within the array 500a, and the center circles represent the contact areas. The area labeled as "C" is shown in greater detail in FIG. 5b.

Referring to FIG. 5b, facet A is the cross-section of individual diode element 501b, when sectioned via a plane normal to the top surface of the diode element 501b and positioned across the diameter of the hole 502b. Facet B depicts the sidewall of diode element 501b. A p+ layered doped region 503b surrounds holes 502b and certain other portions 506b extending radially outwards along horizontal x- and vertical y-axes from the holes 502b on the upper surface of the wafer 500b. Alternatively, another embodiment of the present invention can have a p+ layered doped region surrounding holes and certain other portions extending along a horizontal x-axes only. it is possible to have Further, a silicon dioxide ring grown on the doped region 503b forms a cylindrical wall for the holes 502b. The lower end of the holes 502b are covered by an oxide layer 505b formed by the controlled oxidation of the back side of the wafer 500b. The bottom surface of the diode 501b is coated with an oxide layer 507b. Another n+ layer 508b is diffused into the wafer 500b. It should be noted that the above description is merely illustrative of the present invention and not a statement about the only applicability of the present invention. A person of ordinary skill in the art would appreciate that the novel aspects of the present invention can be implemented in other ways as well.

It should be noted that the present invention discloses a preferred approach to manufacturing the diodes disclosed herein. The conductive layer, situated between the two insulating layers, cannot be deposited using any process known in the art. Specifically, ion implantation or impurity diffusion is not an effective approach to creating a conductive layer atop an insulating layer. Forming a conductive layer using metals, as some prior art references may have suggested, is also not an effective approach because it is difficult to create a continuous metal layer from the front side, through the hole, and to the backside without creating voids or discontinuities. Furthermore, using metals can result in the creation of non-planar device surfaces. Maintaining wafer planarity is critical in device processing and assembly. Additionally, in certain devices, the holes are filled by a single insulating layer between which a conductive material is placed. While possible to fill the entire hole with molten conductive material, such devices are often subjected to high dark leakage current.

In light of the above described challenges in producing photodiodes, provided below are details of how photodiodes of the present invention are preferably manufactured. The manufacturing process will be illustrated with reference to FIGS. 6a through 6c.

Figure 6A:
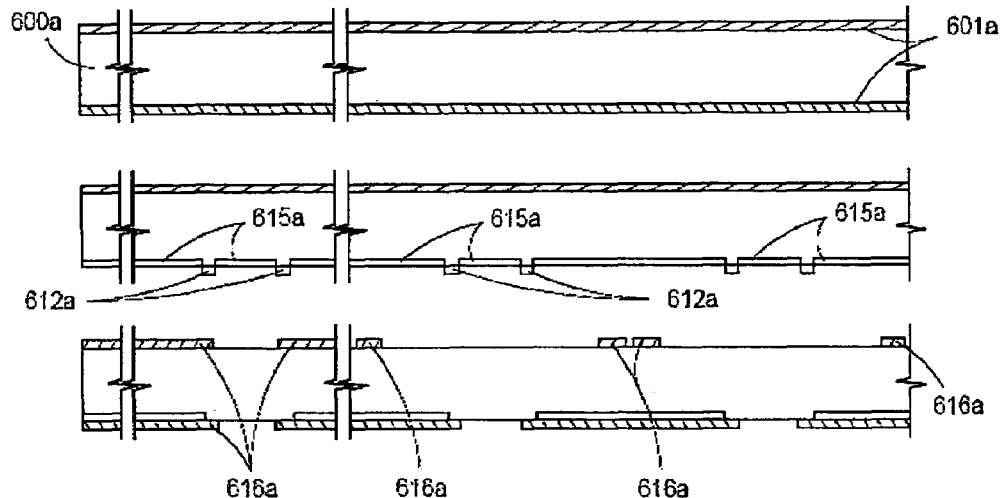
FIG. 6a depicts a side planar view of a first set of steps in the formation of photodiodes of the present invention.

Referring to FIG. 6a, section view A—A (1) depicts a cross-section of the start material. In one embodiment, the start material is a round sliced wafer 600a made of a suitable semiconductor material. For example, and by no way of limitation, silicon may be utilized in accordance with the principles of the present invention. In one embodiment, the wafer or semiconductor device 600a possesses the following specifications: round slice wafer diameter 100 mm, resistivity 800–1200 Ωcm, thickness 275 μm, and double side polish. The above specifications are not limiting and may be modified to suit the design, fabrication and functional requirements suggested herein.

Typically, a wafer, if unpolished, can have a rough texture and may not exactly conform to parameters, such as surface flatness, thickness specifications etc. Therefore, it is preferred that the wafer 600a has a double-side polish. Additionally, before further fabrication steps are taken, the polished wafer 600a is subjected to a standard mask oxidation process that results in layers 601a of $SiO_2$ on both front and back surfaces of the wafer 600a. The tasks of polishing and standard mask oxidation are known to those of ordinary skill in the art having the benefit of this disclosure and, consequently, will not be further detailed herein.

As shown in section view A—A (2) of FIG. 6a, a n+ layer is formed through selective diffusion of n+ dopants. Prior to n+ diffusion on the back side of the wafer 600a, the $SiO_2$ sublayer 601a is selectively etched on the back side to ensure certain regions, such as area 612a, retain the $SiO_2$ sublayer. The process of selective etching and diffusion is well known in the prior art.

After the etching has been selectively performed, the regions, which are devoid of the protective the $SiO_2$ layer, are subjected to a controlled n+ diffusion resulting in the formation of shallow n+ regions 615a on the back side of the wafer 600a. There are many different approaches available in the prior art to carry out this diffusion process and the choice of the diffusion method is dependent on various factors, such as the diffusion coefficient of the dopant, permissible error in diffusion depth, and diffusion source.

Referring to section view A—A(3) of FIG. 6a, once the n+ diffusion on the back side of the wafer 600a is complete, a p+ fishbone (or non-fishbone) mask is applied on the front side of the wafer 600a and a p+ mask is applied on the back side. Alternatively, a full diffusion approach may be applied, instead of a fishbone mask. The front side of the wafer 600a, coated with the $SiO_2$ layer 601a is preferably subjected to selective etching, utilizing the p+ fishbone mask to ensure certain regions, such as 616a, retain the $SiO_2$ layer while others remain devoid of it. This is achieved via any suitable masking technique including, but not limited to, p+ fishbone, followed by selective etching.

In a preferred embodiment, p+ fishbone masking is used and preferably involves the following steps. First, a photographic mask, possessing the desired fishbone pattern or grid, is produced. In general, photomasks are high precision plates containing microscopic images of electronic circuits. They are made from flat pieces of quartz or glass with a layer of chrome on one side. Etched in the chrome is a portion of an electronic circuit design. The circuit design on the mask is also referred to as the geometry of the mask.

More specifically, fishbone patterns or grids possess a tightly coupled architecture, thereby facilitating better geometry for a sensor array. The dies are arranged in rows and columns on the mask. For example, this may typically be a chromium pattern produced on a glass plate in accordance with the principles of the present invention. Other practically appropriate patterns and masking techniques could be used in the present invention without departing from the spirit and scope of the invention. U.S. Pat. Nos. 6,426,991 and 3,760,385 are hereby incorporated by reference.

Figure 6B:
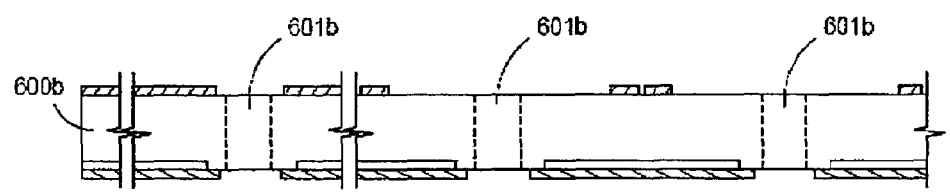
FIG. 6b depicts a side planar view of a second set of steps in the formation of photodiodes of the present invention.
Figure 6B:
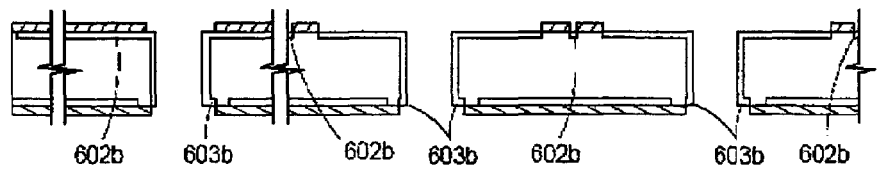

Referring to FIG. 6b, holes are laser cut within the wafer. The formation of holes within the wafer substrate is followed by boron diffusion and the concurrent p+ doping of the opening areas and diffusion of boron onto the walls of the holes. Methods used to form holes in substrates comprise, but are not limited to, reactive ion etching, photo patterning, and laser-based techniques, such as laser ablation, laser micromachining, and laser scribing. Lasers offer considerable flexibility and precision focus, thereby making it an effective means for forming small diameter holes, such as micro-holes having diameter of the order of approximately 125 μm or less. Preferred apparatuses, methods or systems perform laser-scribing via a Yttrium-Aluminum-Garnet (YAG) solid state laser (Q switched or pulsed), for example Neodymium (Nd:YAG) laser, Erbium (Er:YAG) laser or Holmium (Ho:YAG) laser, operating at a suitable wavelength to form micro-structures, such as trenches, kerfs, or holes. In one preferred embodiment, to form the holes, a Nd:YAG laser having a 1.06 μm emitted beam wavelength and an electrical efficiency of 2%–4% is used in conjunction with a mechanism for adjusting the position of a wafer-holding chuck.

Referring to section view A—A (3) of FIG. 6a, prior to undergoing laser scribing, wafer 600a is preferably held in position for scribing by a vacuum chuck (not shown). It will be appreciated, however, that other types of article-holding devices may be used within the spirit and scope of the present invention. The wafer 600a has a plurality of $SiO_2$ formations 616a and discontinuous n+ layers 615a.

Referring now to FIG. 6b, regions 601b enclosed within pairs of dotted lines, as illustrated in section view A—A (4), represent the portion of the wafer 600b where cutting, via the preferred laser scribing apparatus, is conducted to form the contact holes. The aperture of the laser device used and the focal distance of the cutting beam determine the diameter of hole. Preferably, the diameter of holes 601b is at or about 125 μm. A person of ordinary skill would appreciate that the specifications of the holes, in terms of diameter and depth, are not restricted to the aforesaid specifications and can be adjusted to suit varied economical, technical or operational specifications.

Holes 601b are formed by the laser beam emitted from the laser scribing device such that they extend through the wafer 600b, across its thickness in entirety, and to the back side of the wafer 600b. The holes 601b serve as contact holes used for making an electrical connection between a front surface p+ layer and a back surface electrical contact.

Referring to section view A—A (5) of FIG. 6b, once contact holes 601b have been cut, open areas and sidewalls of the holes 601b are doped with a material of selected conductivity type, such as n-type or p-type. In one embodiment, the p+ doping layers are formed at various regions indicated therein, as p+ suction diode (p+ S.D.) 602b, p+ back side (p+ B.S.) 603b, and p+ active pixel (p+ A.P.) 604b, respectively. In one embodiment, the doping process possesses the following specifications: a dopant Boron (B), a dopant conductivity type p+, a sidewall target junction depth of approximately 1 to 2 micron, and a dopant source $BBr_3$. Target junction depths, as specified in the specifications, can be achieved by the use of boron diffusion techniques though there are other approaches available in the prior art.

Figure 6C:
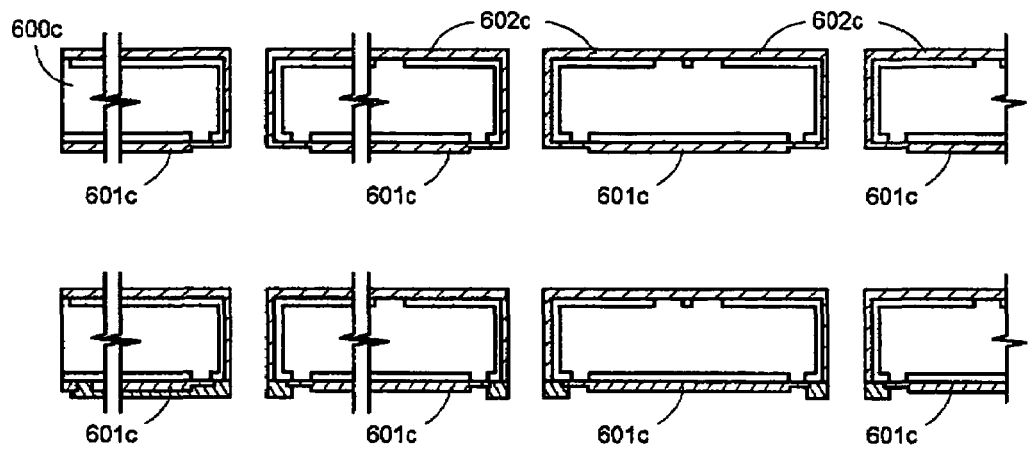
FIG. 6c depicts a side planar view of a third set of steps in the formation of photodiodes of the present invention.
Figure 6D:
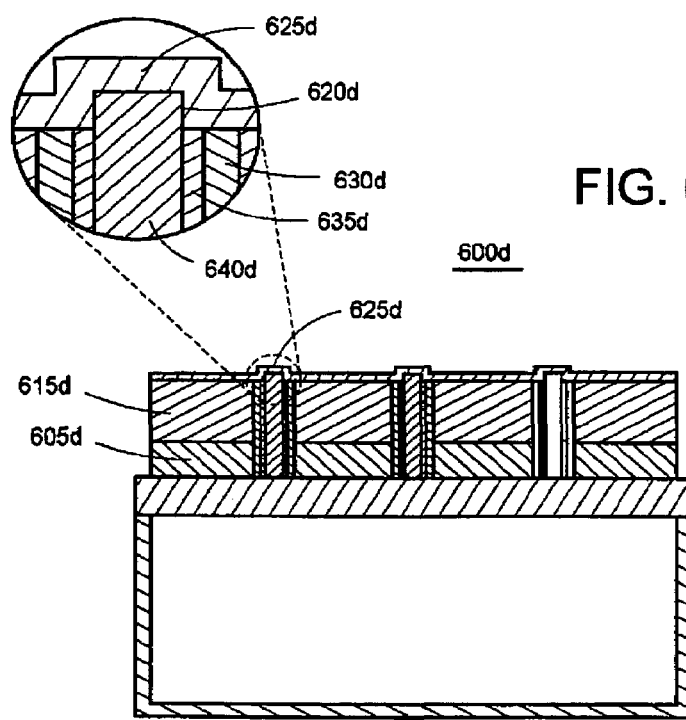
FIG. 6d depicts a side planar view of a photodiode of the present invention.

As shown in section view A—A (6) of FIG. 6c, at least a portion of the $SiO_2$ layer is stripped off and an anti-reflective (AR) coating layer 602c is deposited on the wafer 600c. This is followed by the growth of a layer of $SiO_2$ via a standard oxidation process. Preferably, the process-related specifications are as follows: a layer thickness of 2900 angstroms at a rate of 3 λ/4 @540 nm if a fishbone structure is used. If a non-fishbone structure is used, a layer thickness of at or about 950 to 1000 angstroms is the preferred specification.

Referring to section view A—A (7) of FIG. 6c, the front side of the wafer 600c comprises AR coating 602c and the back side comprises a grown oxide $SiO_2$ layer. A contact window masking, followed by etching of the contact window oxide on the back side of the wafer 600c, is performed. An n+ ring is etched at the periphery of the wafer. The back side of the wafer 600c is metallized using an alloy of aluminum-nickel-gold (Al—Ni—Au), after which metal masking and etching is performed on the back side of the wafer 600c.

The above discussion is aimed towards providing a preferred embodiment incorporating the novel aspects of the present invention and it should be understood that the foregoing illustration is not the only application where the present invention can be reduced down to practice. The present invention can be suitably modified to incorporate other possible embodiments as well. The scope of the invention is defined solely by the accompanying claims and within the scope of the claims; the present invention can be employed in various other situations. For example, other device-to-device isolation, active are patterning, active area reduction, reduction of crosstalk, formation of electrical contacts via through holes, and reduction of radiation damage techniques could be employed while still staying within the scope of the present invention.

What is claimed is:

1. A photodiode array comprising:
   a substrate having at least a front side and a back side;
   a plurality of photodiodes integrally formed in the substrate forming the said array;
   a plurality of electrical contacts in electrical communication with said back side; and
   a plurality of suction diodes positioned at selected locations within the array, wherein the fabrication of said array involves a masking process comprising the steps of:
      applying a first p+ mask on said front side and
      applying a second p+ mask on said back side.

2. The array of claim 1, wherein said substrate is made of n doped silicon.

3. The array of claim 1, wherein the substrate is encircled by a metallic ring.

4. The array of claim 3, wherein silicon underneath the metal ring is doped with an impurity of a selected conductivity type.

5. The array of claim 1, wherein each of said plurality of photodiodes and suction diodes have a front surface, back surface, and side walls and wherein said side walls are covered by a first insulating layer, a first conducting layer, and a second insulating layer.

6. The array of claim 5 wherein the first insulating layer is an oxide.

7. The array of claim 5 wherein the second insulating layer is an oxide.

8. The array of claim 5 wherein the conductive layer is doped poly-silicon.

9. The array of claim 5 wherein the second insulating layer is in physical communication with a filler.

10. The array of claim 9 wherein the filler is undoped poly-silicon.

11. The array of claim 1 wherein each of said photodiodes has a middle layer juxtaposed between a front layer and a back layer.

12. The array of claim 11 wherein said middle layer comprises a doped material of n conductivity type.

13. The array of claim 11 wherein said back layer comprises an n+ layer in electrical communication with a metal to form a cathode.

14. The array of claim 11 wherein said front layer comprises a doped material of p+ conductivity type.

15. The array of claim 14 wherein front p+ layer is in electrical communication with a metal to form an anode.

16. A photodiode comprising:
   a substrate having a front side and a back side;
   a front layer;
   a back layer; and
   a detecting region juxtaposed between said front layer and said back layer; wherein said photodiode is adjacent to a connection region having a first insulating layer, a first conducting layer, and a second insulating layer and wherein said photodiode is made using a process comprising the steps of:
      applying a first p+ mask on said front side;
      applying a second p+ mask on said back side; and
      forming said connection region using a hole cutting technique.

17. The photodiode of claim 16 wherein said process for making the photodiode further comprises the step of diffusing boron.

18. The photodiode of claim 16 wherein said process for making the photodiode further comprises the step of performing a p+ doping of the connection region.

19. The photodiode of claim 16 wherein said each of said connection region has a diameter of at or about 125 micron.

20. The photodiode of claim 16 wherein at least one of said connection regions functions as a conduit for forming an electrical connection between said first layer and a back surface electrical contact.

21. The photodiode of claim 16 wherein said front layer comprises a doped material of p+ conductivity type and said front p+ layer is in electrical communication with a metal to form an anode.

22. A photodiode array comprising:
   a substrate having at least a front side and a back side;
   a plurality of photodiodes integrally formed in the substrate forming the said array wherein each of said photodiodes has a middle layer juxtaposed between a front layer and a back layer;
   a plurality of electrical contacts in electrical communication with said back side; and
   a plurality of suction diodes positioned at selected locations within the array, wherein the fabrication of said array involves a masking process comprising the steps of:
      applying a first n+ mask on said front side and
      applying a second n+ mask on said back side.

23. The array of claim 22 wherein said middle layer comprises a doped material of p conductivity type.

24. The array of claim 22 wherein said back layer comprises a p+ layer in electrical communication with a metal to form a anode.

25. The array of claim 22 wherein said front layer comprises a doped material of n+ conductivity type.

26. The array of claim 25 wherein front n+ layer is in electrical communication with a metal to form a cathode.

27. The array of claim 22, wherein the substrate is encircled by a metallic ring.

28. The array of claim 27, wherein silicon underneath the metal ring is doped with an impurity of a selected conductivity type.

29. The array of claim 22, wherein each of said plurality of photodiodes and suction diodes have side walls wherein said side walls are covered by a first insulating layer, a first conducting layer, and a second insulating layer.

30. The array of claim 29 wherein the first insulating layer is an oxide.

31. The array of claim 29 wherein the second insulating layer is an oxide.

32. The array of claim 29 wherein the conductive layer is doped polysilicon.

* * * * *